United States Patent
Cohen et al.

(10) Patent No.: US 12,400,057 B2
(45) Date of Patent: Aug. 26, 2025

(54) HIERARCHY-AWARE INTEGRATED CIRCUIT LAYOUT DESIGN

(71) Applicant: INTERNATIONAL BUSINESS MACHINES CORPORATION, Armonk, NY (US)

(72) Inventors: Tomer Abraham Cohen, Binyamina (IL); Muhammad Suleiman, Nazareth (IL); Doris Bittruf, Westford, VT (US); Noam Jungmann, Holon (IL)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 17/655,225

(22) Filed: Mar. 17, 2022

(65) Prior Publication Data

US 2023/0297751 A1    Sep. 21, 2023

(51) Int. Cl.
*G06F 30/31*    (2020.01)
*G06F 30/392*   (2020.01)

(52) U.S. Cl.
CPC ............ *G06F 30/31* (2020.01); *G06F 30/392* (2020.01)

(58) Field of Classification Search
CPC ...................................................... G06F 30/31
USPC .......................................................... 716/139
See application file for complete search history.

(56) References Cited

U.S. PATENT DOCUMENTS

| | | | |
|---|---|---|---|
| 8,667,444 B2 | 3/2014 | Henrickson et al. | |
| 10,210,299 B1 | 2/2019 | Ginetti | |
| 10,223,495 B1 * | 3/2019 | Agrawal | G06F 30/398 |
| 10,671,793 B1 | 6/2020 | Deshpande | |
| 10,896,280 B1 | 1/2021 | Rashingkar | |
| 2017/0017746 A1 * | 1/2017 | Jiang | G06F 30/392 |

OTHER PUBLICATIONS

Gullapalli, Vijay, "Best practices' improve hierarchical design constraints", Tech Online, Wireless and Networking Designline, EE Times, Dec. 1, 2003, 4 pages, <https://www.eetimes.com/best-practices-improve-hierarchical-design-constraints/>.

* cited by examiner

*Primary Examiner* — Eric D Lee
(74) *Attorney, Agent, or Firm* — Edward J. Wixted, III

(57) ABSTRACT

In an approach, a processor identifies a current cell depicted in an integrated circuit layout tool, the current cell of a hierarchical layout comprises a plurality of cells. A processor generates an overlay, the overlay comprising an abstraction of at least one object present in a higher level of the hierarchical layout that overlaps with the current cell. A processor projects the overlay onto the current cell.

20 Claims, 4 Drawing Sheets

HIERARCHY-AWARE INTEGRATED CIRCUIT LAYOUT DESIGN

BACKGROUND

The present invention relates to integrated circuit design, and more specifically, to an approach to, in a layout design tool, provide an overlay that is projected onto a cell, the overlay corresponding to objects present in higher levels of the hierarchy which may interfere or otherwise overlap with the cell as displayed.

Electronic design automation (EDA), or electronic computer-aided design (ECAD), is a category of software tools for designing electronic systems such as integrated circuits and printed circuit boards. Such tools allow a chip designer to design and analyze entire semiconductor chips.

Place and route is a stage in the design of integrated circuits. Place and route is composed of two steps, placement and routing. Placement involves deciding where to place all electronic components, circuitry, and logic elements in a generally limited amount of space within a chip. Routing decides the exact design of all the wires needed to connect the placed components and must implement all the desired connections while following rules and limitations of manufacturing processes. The final result when placing and routing is finished is the layout. The layout is a geometric description of the location and rotation of each part and the exact path of each wire connecting them.

A hierarchical design is an electronic circuit design having a collection of different levels, where each higher level hides the details and shapes of the lower levels to simplify the design process. A design hierarchy allows the circuit design to be broken down into a collection of smaller designs or levels, thus reducing visual complexity of the design process.

SUMMARY

According to an embodiment of the present invention, a computer-implemented method, computer program product, and computer system are provided. A processor identifies a current cell depicted in an integrated circuit layout tool, the current cell of a hierarchical layout comprises a plurality of cells. A processor generates an overlay, the overlay comprising an abstraction of at least one object present in a higher level of the hierarchical layout that overlaps with the current cell. A processor projects the overlay onto the current cell.

DETAILED DESCRIPTION

Embodiments of the present invention recognize that traditional layout electronic design automation (EDA) tools support a "bottom-up" methodology approach. Embodiments of the present invention recognize that, in hierarchical layout design of advanced technologies, building sub-blocks in isolation and without awareness of where the sub-blocks are placed in the context of a top-level macro view can lead to integration problems in later stages of the work or when applying engineering changes. Embodiments of the present invention recognize that custom layout design (e.g. array design) requires strong communication between the layout designer and the electrical designer and that, in many instances, the electrical designer may want to provide high level guidance for dedicated routes and a wire plan which should be honored by the layout designer throughout the hierarchy. Embodiments of the present invention recognize that layout designers often face challenges when planning the layout in congested areas of the design.

Embodiments of the present invention recognize that a change in methodology is required in order to enable a combination of "bottom-top" and "top-bottom" layout design approaches. Embodiments of the present invention describe an approach to ensure that sub-blocks do not block routing tracks for critical signals in higher levels, a problem that increases in instances of multi-occurrence cells, where we might have different objects as obstructions at each different instance of such a cell. Embodiments of the present invention describe a hierarchy aware editing tool to support a top-bottom/bottom-top physical layout design. Such an approach utilizes a hierarchy aware view that contains an abstraction of objects designed in higher levels of the hierarchy which interfere with or overlap any instance of the sub-cell presented in the view (also referred to as a "sky picture"). Within a particular sub-cell, a rendering of higher levels of the hierarchy which interfere with or overlap the particular sub-cell can be projected into the sub-cell and used for guidance during sub-cell design. Embodiments of the present invention recognize that better planning results in area saving as congestion and issues are predicted ahead of time and that embodiments of the present invention simplify coordination and communication between, for example, an electrical designer and a layout designer. Utilizing the approach described by embodiments of the present invention, multiple users (e.g., electrical designer, layout designer) are able to work in parallel on separate levels of the hierarchy. In contrast, utilizing a flat design approach, only a single person is able to work on the design at a time.

Embodiments of the present invention will now be described in detail with reference to the Figures.

Figure 1:
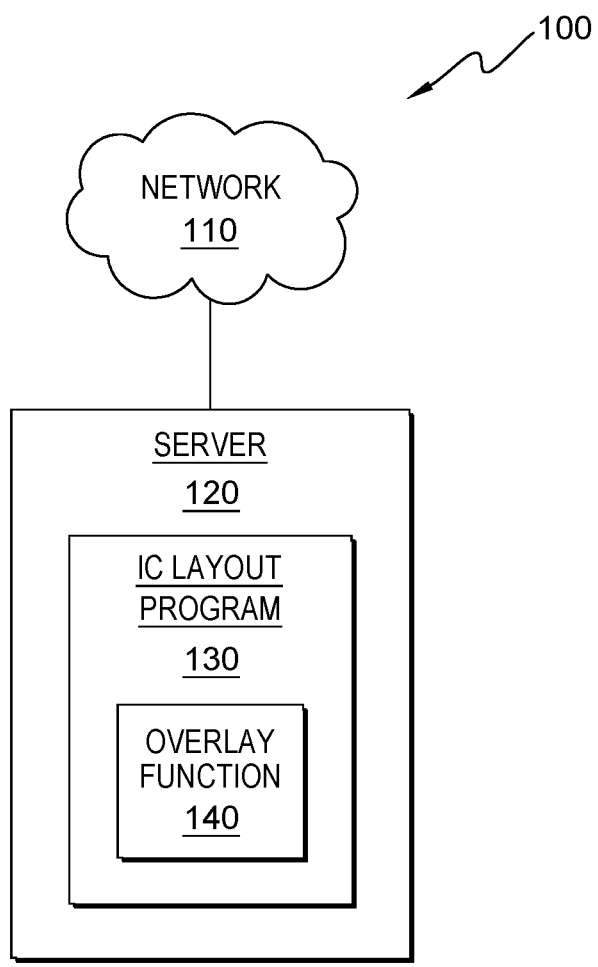
FIG. 1 is a functional block diagram illustrating a computer environment, in accordance with an embodiment of the present invention.

FIG. 1 is a functional block diagram illustrating a computing environment, generally designated 100, in accordance with one embodiment of the present invention. FIG. 1 provides only an illustration of one embodiment and does not imply any limitations with regards to the environments in which different embodiments may be implemented.

In the depicted embodiment, computing environment 100 includes server 120 connected to network 110. Network 110 may be a local area network (LAN), a wide area network (WAN), such as the Internet, the public switched telephone network (PSTN), any combination thereof, or any combination of connections and protocols that will support communications between server 120 and other computing device(s) (not shown), in accordance with embodiments of the present invention. Computing environment 100 may include additional servers, computing devices, or other devices not shown.

Server 120 may be a management server, a web server, or any other electronic device or computing system capable of sending and receiving data. In some embodiments, server 120 may be a laptop computer, tablet computer, personal computer (PC), a desktop computer, a smartphone, or any programmable electronic device. In some embodiments, server 120 may represent a server computing system utilizing multiple computers as a server system, such as in a cloud computing environment. Server 120 includes integrated circuit (IC) layout program 130 and overlay function 140. Server 120 may include components, as depicted and described in further detail with respect to FIG. 4.

IC layout program 130 is an integrated circuit layout program that facilitates digitally designing the layout of a design at, for example, device, cell, block, and chip levels. IC layout program 130 supports hierarchical designing such that multiple levels of a hierarchy can be viewed and a user is able to ascend or descend into a particular level of the hierarchy. Hierarchical designing hides detail in a design. Essentially, lower level objects include details and higher level objects may graphically represent lower level objects as an outline that displays only the boundary of the cell definition. At the lowest level, a cell that does not contain any instances of other cells is at the bottom of the hierarchy and is called a leaf cell. A cell that is not contained as an instance in any other cell is at the top of the hierarchy and may be referred to as the root cell. All cells in between are referred to as composition cells and compose the body of the hierarchy. An instance is a particular cell at a given level of the hierarchy. IC layout program 130 may be, for example, Virtuoso® Layout Suit. In one embodiment, IC layout program 130 resides on server 120. In other embodiments, IC layout program 130 may reside on another server or another computing device.

Overlay function 140 operates to generate an overlay that can be projected on a particular view at a level of the hierarchy when a user is using IC layout program 130. In general, overlay function 140 generates an overlay that includes the location of objects designed at higher levels of the hierarchy which may interfere with or overlap any instance of the cell. The overlay may include, for example, all of the wires from all levels of the hierarchy. Overlay function 140 may also generate informational popups or balloons that include, for example, route details, when hovering over a portion of the overlay. When a portion of the overlay is selected, overlay function 140 may allow for the source hierarchy to be opened in, for example, a new window (e.g., a level of the hierarchy is opened in a new window that includes the source of the object that caused the overlay to be generated at the selected location). Overlay function 140 may either generate such an overlay from the top of the hierarchy to the current cell or, in some embodiments, an intermediate level of the hierarchy may be selected as a starting point for generating the overlay, rather than a top layer of the hierarchy. In some embodiments, overlay function 140 is a function of IC layout program 130. In other embodiments, overlay function 140 may be an external application implemented as a microservice or module that operates to provide the above described functionality to an IC layout program, such as IC layout program 130. In one embodiment, overlay function 140 resides on server 120. In other embodiments, overlay function 140 resides on another server, or another computing device, provided that overlay function 140 can communicate with IC layout program 130.

Figure 2:
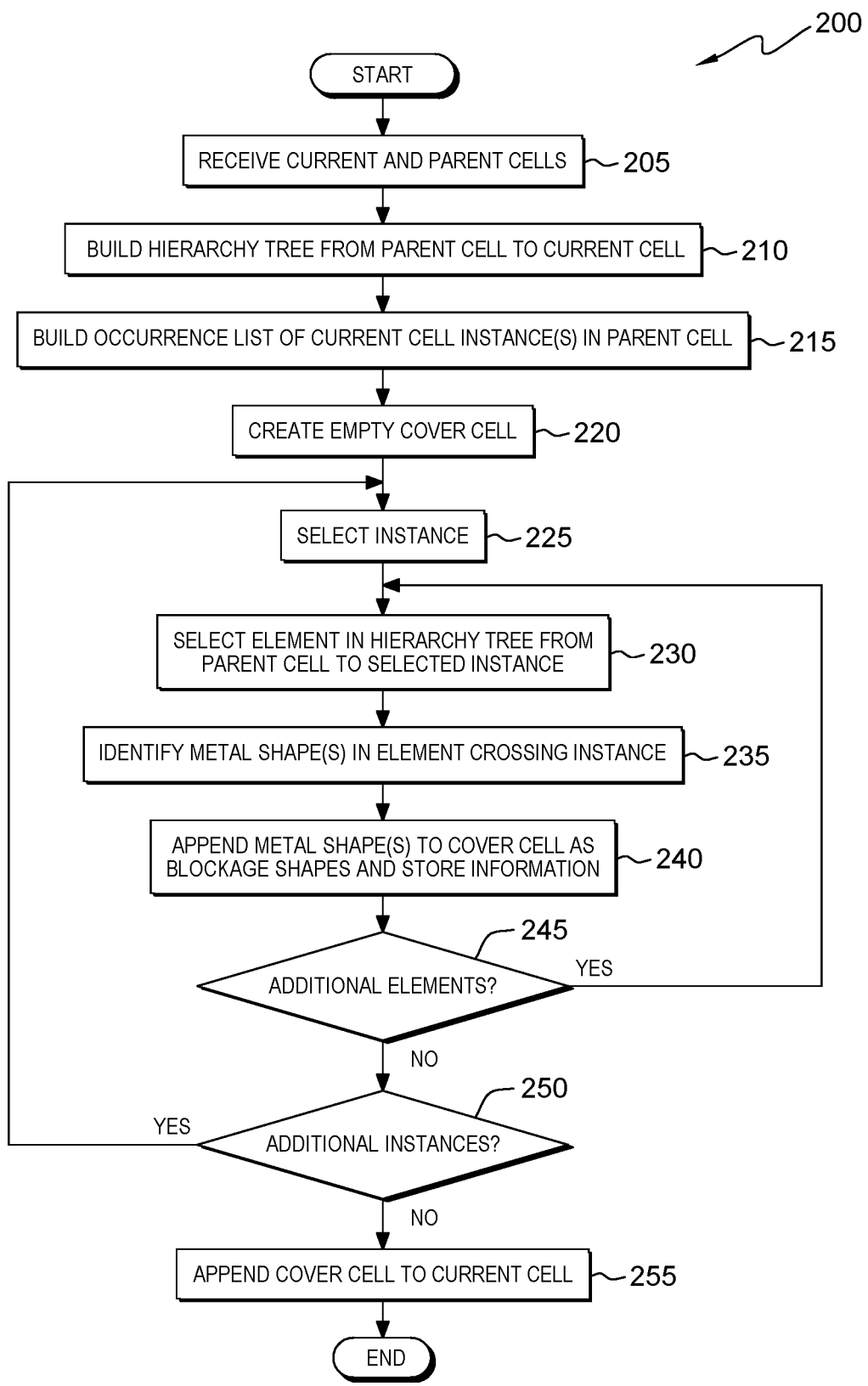
FIG. 2 is a flowchart depicting operational steps of an overlay function of an integrated circuit (IC) layout program, executing within the computer environment of FIG. 1, for generating an overlay that comprises an abstraction of objects designed in higher levels of the hierarchy of the device design which interfere with or overlap with any instance of the currently depicted cell, in accordance with an embodiment of the present invention.

FIG. 2 depicts a flowchart 200 for the steps of overlay function 140, a function of IC layout program 130, for generating an overlay that comprises an abstraction of objects designed in higher levels of the hierarchy of the device design which interfere with or overlap with any instance of the currently depicted cell.

In one embodiment, initially, a user is utilizing IC layout program 130 to design an integrated circuit that includes a hierarchical design and layout including at least a current cell (i.e., a cell that is to be viewed and provided with the generated overlay) and a parent cell. The parent cell may be, for example, a top cell or an intermediate level cell of the hierarchy. As an example, a custom layout design, such as an array design, may include a layout designer and an electrical designer. The electrical designer may have provided high level guidance for dedicated routes and a wire plan that should be honored by the layout designer throughout the hierarchy. Overlay function 140 will generate an overlay in such an instance, where elements of the design are already specified in different levels of the hierarchy than the currently depicted cell.

In step 205, overlay function 140 receives a current cell and a parent cell for the integrated circuit design opened in IC layout program 130. In some embodiments, the current cell is the cell that is being currently displayed on a computing device such as server 120. In some embodiments, the current cell is a multi-occurrence sub-cell within the hierarchy, meaning that there a multiple instances of the current cell within the design. In such an embodiment, any design edits made to the current cell are applied to each instance of the multi-occurrence cell. Accordingly, edits need only be made to the selected current cell and may be duplicated to each instance in the integrated circuit design. Embodiments of the present invention recognize that, in contrast, a flat design process may require that each instance be built separately. In some embodiments, the parent cell is a cell at the top level of the hierarchical design. In other embodiments, the parent cell is a cell at an intermediate layer of the hierarchical design that is between the top level and the level occupied by the current cell. In such an embodiment, a user of IC layout program 130 may select the parent cell. If no selection of a parent cell is made, overlay function 140 may default to using a cell at the top level of the hierarchical design as the parent cell.

In step 210, overlay function 140 builds and stores a hierarchy tree from the parent cell to the current cell. The hierarchy tree may include all of the cells at different levels of the hierarchy from the parent cell to the current cell. Overlay function 140 may access information stored by IC layout program 130 to identify and determine the particular cells that comprise such a range.

In step 215, overlay function 140 builds and stores an occurrence list of instances of the current cell that are in the parent cell. A particular cell at a given level of a hierarchy is called an instance. Accordingly, the current cell may correspond to either a single instance or a plurality of instances at the level of the current cell. Overlay function 140 may access information stored by IC layout program 130 to identify the location of each instance within the overall IC design in order to determine which particular instances are in the parent cell.

In step 220, overlay function 140 creates an empty cover cell. The empty cover cell is an empty cell that will be utilized to create the overlay. In some embodiments, the empty cover cell is of a size equal to the current cell. As described below, the empty cell cover will be used for blockage shape placement corresponding to objects, such as wires, that may interfere or otherwise overlap with one or more instances of the current cell, and, upon applying all such blockage shapes to the cover cell, the cover cell will be projected onto the current cell as an overlay for reference of users designing the layout of the current cell.

In step 225, overlay function 140 selects an instance from the occurrence list. In a first iteration of step 225, overlay function 140 selects any instance from the occurrence list. In subsequent iterations of step 225, overlay function 140 selects an instance from the occurrence list not previously selected. As described above, the instances that comprise the occurrence list are instances of the current cell that are present or overlap with the higher level parent cell in the hierarchical design of the IC.

In step 230, overlay function 140 selects an element from within the hierarchy tree from the parent cell to the selected instance. In general, each element is a cell at any level of the hierarchy tree as the hierarchy tree comprises cells from the parent cell to the current cell. In a first iteration of step 230, overlay function 140 selects any element from the hierarchy tree. In subsequent iterations of step 230, overlay function 140 selects an element from the hierarchy tree not previously selected such that, upon the final iteration, every element from the parent cell to the selected instance is selected. Each selected element is an element that overlaps or interferes with the selected instance of the current cell.

In step 235, overlay function 140 identifies one or more metal shapes that are within the selected element that cross over the selected instance. In general, such metal shapes correspond to, for example, top level placement and wire routing plans that may have been performed by an electrical designer at higher level design of the IC within the hierarchy. Overlay function 140 compares the location of the one or more metal shapes within the selected element to the location occupied by the selected instance of the current cell, and identifies the specific location(s) corresponding to any overlap or interference. As overlay function 140 performs step 235 iteratively, subsequent to overlay function 140 performing the final iteration, overlay function 140 identifies each metal shape present within every element from the parent cell to the selected instance that crosses over the selected instance.

In step 240, overlay function 140 appends any identified metal shapes to the cover cell as one or more blockage shapes and stores information about the identified metal shape(s) to each respective blockage shape. Overlay function 140 appends each identified metal shape onto the cover cell at a location within the view that corresponds to the location overlap or interference with the current cell. A blockage shape is shape used to designate a blockage and the appearance may vary based on the type of IC layout program (e.g., IC layout program 130) being used. In general, the blockage shape will have an appearance different than other shapes that might be used when designing the layout of a cell and may, in some embodiments, stand out against such other shapes or objects. In some embodiments, overlay function 140 attaches a label to each blockage shape, the label stating the net name corresponding to the respective identified metal shape. In some embodiments, overlay function 140 stores element information to the blockage shape such as, for example, the cell name and source library from which the element originated. A source library may be a library of standard cells that may be copied and pasted into an IC design.

In decision 245, overlay function 140 determines whether there are additional elements. Overlay function 140 determines whether there are additional elements by accessing the hierarchy tree and determining whether there are additional elements from the parent cell to the selected instance that have not yet been selected. If overlay function 140 determines that there are additional elements to be selected (decision 245, yes branch), overlay function 140 selects an additional element from the hierarchy tree from the parent cell to the selected instance (step 230). If overlay function 140 determines that there are no additional elements to be selected (decision 245, no branch), overlay function 140 determines whether there are additional instances (decision 250).

In decision 250, overlay function 140 determines whether additional instances of the current cell. Overlay function 140 determines whether there are additional instances of the current cell by accessing the occurrence list and determining whether there are additional instances of the current cell that have not yet been selected. If overlay function 140 determines that there are additional instances of the current cell to be selected (decision 250, yes branch), overlay function 140 selects an additional instance from the occurrence list (step 225). If overlay function determines that there are no additional instances of the current cell to be selected (decision 250, no branch), overlay function 140 appends the cover cell to the current cell. Upon determining that there are no additional instances of the current cell to be selected (decision, 250, no branch), overlay function 140 will have iteratively analyzed each instance of the current cell and identified metal shapes present within any level of the hierarchy of each respective instance and, accordingly, appended each identified metal shape to the cover cell as a blockage shape. As such, the resulting cover cell identifies the location of all metal shapes that cross over or interfere with at least one instance of the current cell in the hierarchical levels ranging from the parent cell to each instance of the current cell.

In step 255, overlay function 140 appends the cover cell to the current cell. By appending the cover cell to the current cell, overlay function 140 creates an overlay depicting the location of higher level objects, such as wires, that overlap or otherwise interfere with at least one instance of the current cell. Overlay function 140 iteratively selects each instance of the current cell (e.g., when the current cell is a multi-occurrence cell) and identifies overlapping metal shapes within each instance and appends each identified overlapping metal shape to the cover cell. Accordingly, the overlay projected onto the current cell includes any interfering or overlapping objects that crosses over or otherwise interferes with any instance of the current cell. Essentially, such a view creates a superposition of all overlapping or interfering objects on multi-occurrence cells and projects that information onto the current cell. By providing such information, a layout designer may, for example, make build or make modifications to the current cell (e.g., lower level cells or leaf cells) and be provided with guidance so that the changes can practically be applied to all instances of the current cell or, in some embodiments, duplicated to all instances without requiring individual design edits for each instance. The resulting overlay generally may be used for short detection or guidance in current cell design and prevent, for example, blocking of routing tracks for critical signals in higher levels and especially may assist when planning in congested areas of the IC design. The resulting overlay may be able to be presented in edit in place, descend edit, or other modes that are available within IC layout program 130.

Figure 3:
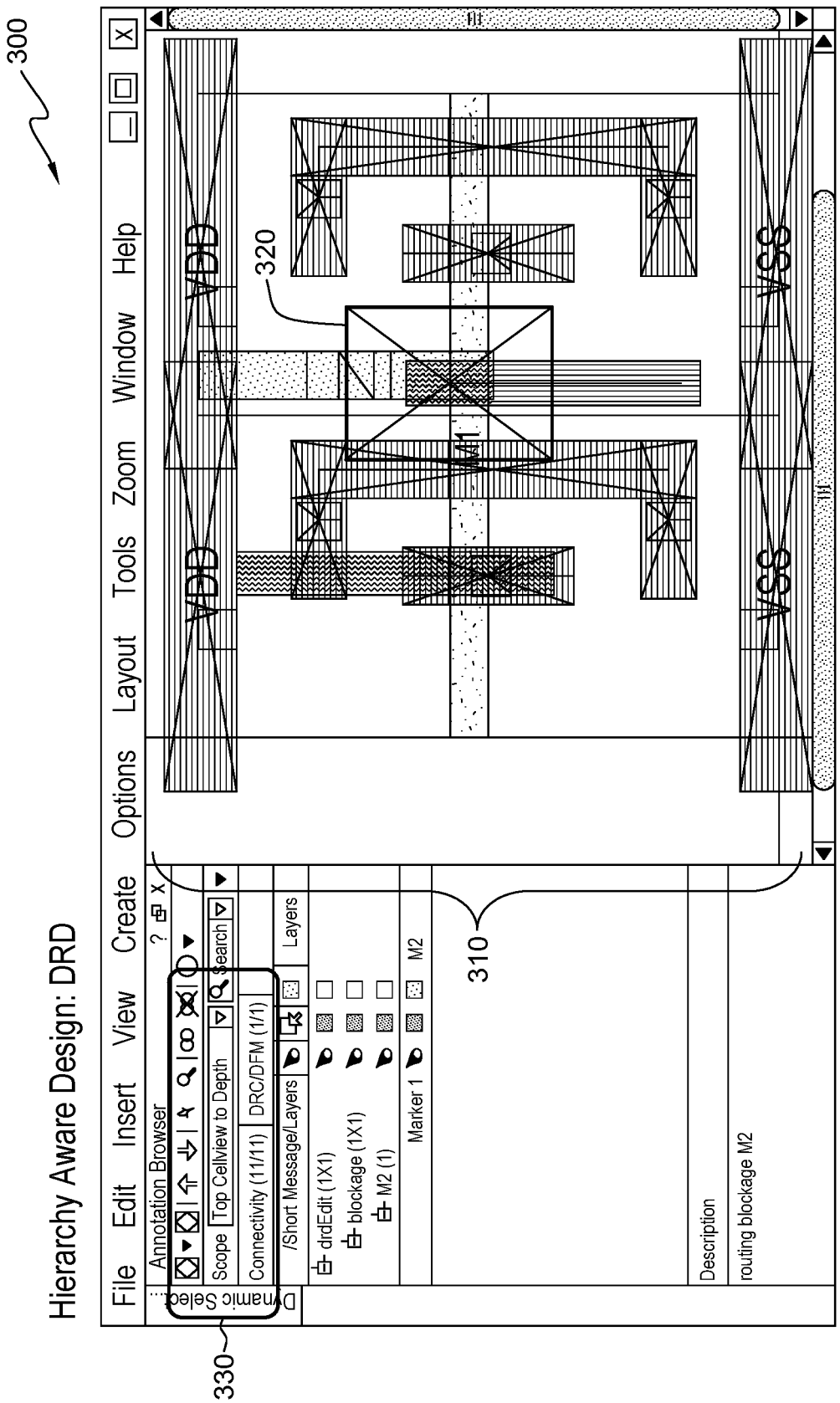
FIG. 3 is an example interface depicting a current cell and an overlay, in accordance with an embodiment of the present invention.

In some embodiments, overlay function 140 utilizes the stored information in each blockage shape to provide additional information about the objects corresponding to the blockage shape or to open the source cell in a new window (e.g., the higher level cell within the hierarchy that was the source of the overlapping or interfering object). In some embodiments, overlay function may cause a view of the source cell to be opened in a new window upon selection of the blockage shape. In some embodiments, information about the blockage shape may be presented when a user hovers a mouse pointer over the blockage shape. For example, an informational balloon may pop-up on the display of the device. The information may include, for example, route details, net name, cell name, and/or source library, FIG. 3 depicts an example interface 300 depicting a current cell 310 and an overlay 320.

The overlay 320 is an overlay generated by overlay function 140 and is presented as a blockage shape that includes objects from one or more higher levels of the hierarchical design which interfere with or overlap the current cell 310. A user may utilize this information to edit current cell 310 to avoid the overlay 320 and thus avoid the higher level object(s).

In some embodiments, the overlay may be turned on and off via an adjustment to the interface. In the example depicted in FIG. 3, a scope setting 330 may be adjusted. In some embodiments, a selection of the parent cell may be selected in the scope setting and overlay 320 will be adjusted accordingly to reflect the change in parent cell.

Figure 4:
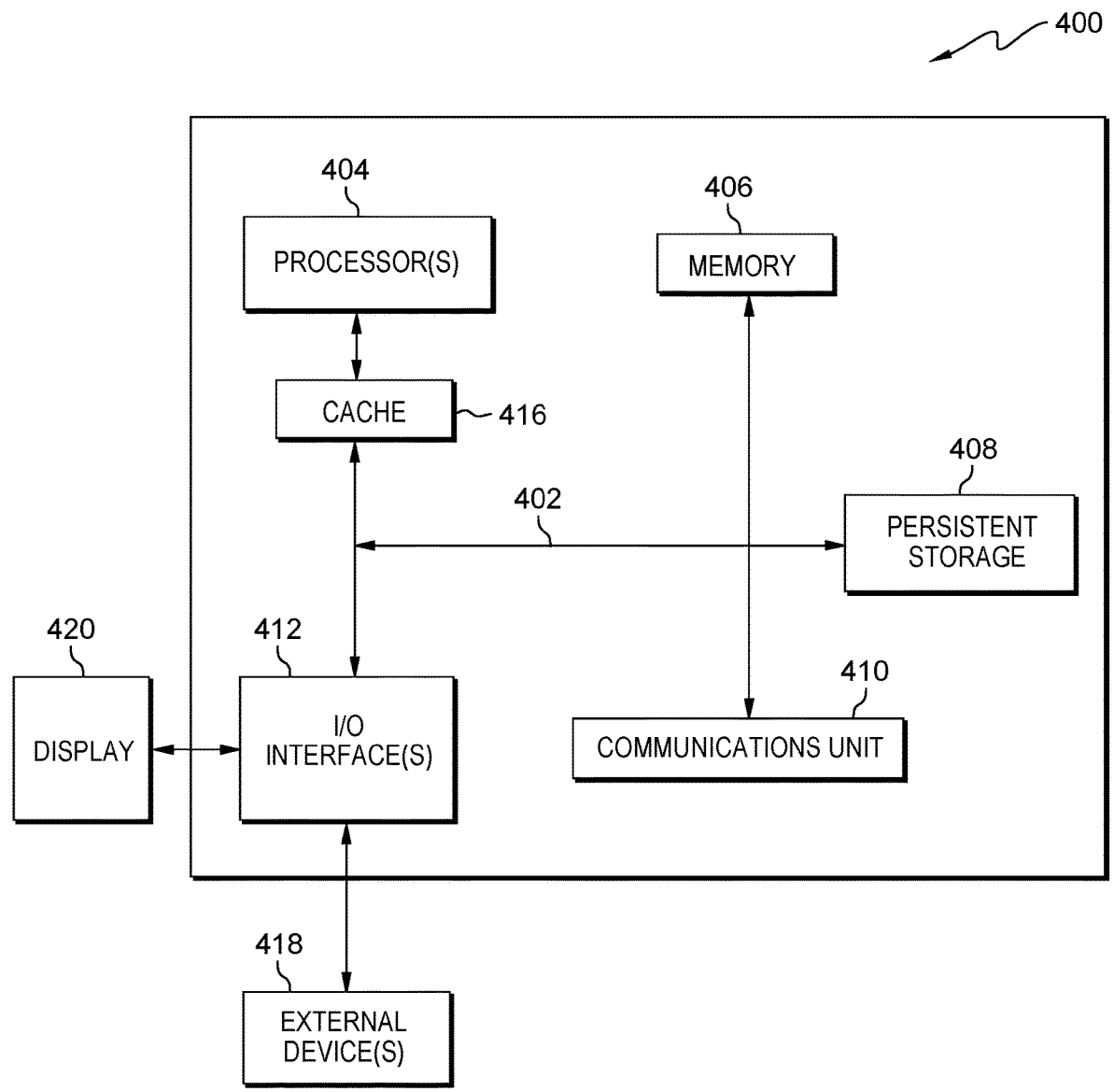
FIG. 4 is a block diagram of components of the server of FIG. 1 in accordance with an embodiment of the present invention.

FIG. 4 depicts a block diagram of components of server 120 in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Server 120 includes communications fabric 402, which provides communications between cache 416, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses or a crossbar switch.

Memory 406 and persistent storage 408 are computer readable storage media. In this embodiment, memory 406 includes random access memory (RAM). In general, memory 406 can include any suitable volatile or non-volatile computer readable storage media. Cache 416 is a fast memory that enhances the performance of computer processor(s) 404 by holding recently accessed data, and data near accessed data, from memory 406.

IC layout program 130 and overlay function 140 may be stored in persistent storage 408 and in memory 406 for execution by one or more of the respective computer processors 404 via cache 416. In an embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links. IC layout program 130 and overlay function 140 may be downloaded to persistent storage 408 through communications unit 410.

I/O interface(s) 412 allows for input and output of data with other devices that may be connected to server computer 102. For example, I/O interface 412 may provide a connection to external devices 418 such as a keyboard, keypad, a touch screen, and/or some other suitable input device. External devices 418 can also include portable computer readable storage media such as, for example, thumb drives, portable optical or magnetic disks, and memory cards. Software and data used to practice embodiments of the present invention, e.g., IC layout program 130 and overlay function 140, can be stored on such portable computer readable storage media and can be loaded onto persistent storage 408 via I/O interface(s) 412. I/O interface(s) 412 also connect to a display 420.

Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
    identifying, by one or more processors, a current cell depicted in a view of an integrated circuit layout tool, wherein:
        the current cell is of a hierarchical layout; and
        the hierarchical layout comprises a plurality of cells;
    generating, by one or more processors, an overlay, the overlay comprising an abstraction of at least one object present in a higher level of the hierarchical layout that overlaps with, and is within a boundary of, the current cell; and
    projecting, by one or more processors, the overlay onto the current cell in the view.

2. The computer-implemented method of claim 1, wherein generating the overlay comprises:
    building, by one or more processors, a hierarchy tree from a parent cell to the current cell;

identifying, by one or more processors, an instance of the current cell that overlaps the parent cell;

creating, by one or more processors, the overlay, the overlay comprising a cover cell, wherein the cover cell is empty; and for at least one element in the hierarchy tree from the parent cell to the current cell:
identifying, by one or more processors, presence of a metal shape in the element crossing the instance; and
appending, by one or more processors, the metal shape into the cover cell as a blockage shape.

3. The computer-implemented method of claim 2, wherein the parent cell is selected from the group consisting of: a top cell of the hierarchical layout and a received selection of a cell at an intermediate level of the hierarchical layout.

4. The computer-implemented method of claim 2, wherein the cover cell is of a size equal to the current cell.

5. The computer-implemented method of claim 2, wherein identifying the instance of the current cell that overlaps the parent cell comprises identifying, by one or more processors, a plurality of instances of the current cell that overlap the parent cell, further comprising:
for each of the plurality of instances:
for at least one element in the hierarchy tree from the parent cell to the current cell:
identifying, by one or more processors, presence of a metal shape in the element crossing the respective instance; and
appending, by one or more processors, the metal shape into the cover cell as a blockage shape.

6. The computer-implemented method of claim 2, further comprising:
attaching, by one or more processors, a net name of the metal shape to the blockage shape; and
storing, by one or more processors, information about the element corresponding to the metal shape to the blockage shape, the information selected from the group consisting of: cell name and source library.

7. The computer-implemented method of claim 1, wherein the overlay includes a blockage shape, further comprising:
receiving, by one or more processors, a selection of the blockage shape; and
responsive to receiving the selection of the blockage shape, performing, by one or more processors, an action selected from the group consisting of: displaying information about an object corresponding to the blockage shape and displaying a window comprising a respective level of the hierarchical layout of the object corresponding to the blockage shape.

8. The computer-implemented method of claim 1, wherein the object only present in one or more higher level views of the hierarchical layout than the view.

9. A computer program product comprising:
one or more computer readable storage media; and
program instructions stored on the one or more computer readable storage media to perform operations comprising:
identifying a current cell depicted in a view of an integrated circuit layout tool, wherein:
the current cell is of a hierarchical layout; and
the hierarchical layout comprises a plurality of cells;
generating an overlay, the overlay comprising an abstraction of at least one object present in a higher level of the hierarchical layout that overlaps with, and is within a boundary of, the current cell; and
projecting the overlay onto the current cell in the view.

10. The computer program product of claim 9, wherein the generating the overlay comprises:

building a hierarchy tree from a parent cell to the current cell;
identifying an instance of the current cell that overlaps the parent cell;
creating the overlay, the overlay comprising a cover cell, wherein the cover cell is empty; and
for at least one element in the hierarchy tree from the parent cell to the current cell:
identifying presence of a metal shape in the element crossing the instance; and
appending the metal shape into the cover cell as a blockage shape.

11. The computer program product of claim 10, wherein the parent cell is selected from the group consisting of: a top cell of the hierarchical layout and a received selection of a cell at an intermediate level of the hierarchical layout.

12. The computer program product of claim 10, wherein the cover cell is of a size equal to the current cell.

13. The computer program product of claim 10, wherein:
the identifying the instance of the current cell that overlaps the parent cell comprises identifying a plurality of instances of the current cell that overlap the parent cell; and
the operations further comprise:
for each of the plurality of instances:
for at least one element in the hierarchy tree from the parent cell to the current cell:
identifying presence of a metal shape in the element crossing the respective instance; and
appending the metal shape into the cover cell as a blockage shape.

14. The computer program product of claim 10, wherein the operations further comprise:
attaching a net name of the metal shape to the blockage shape; and
storing information about the element corresponding to the metal shape to the blockage shape, the information selected from the group consisting of: cell name and source library.

15. The computer program product of claim 9, wherein;
the overlay includes a blockage shape; and
the operations further comprise:
receiving a selection of the blockage shape; and
responsive to receiving the selection of the blockage shape, performing an action selected from the group consisting of: displaying information about an object corresponding to the blockage shape and displaying a window comprising a respective level of the hierarchical layout of the object corresponding to the blockage shape.

16. A computer system comprising:
a processor set;
one or more computer readable storage media; and
program instructions stored on the one or more computer readable storage media to cause the processor set to perform operations comprising:
identifying a current cell depicted in a view of an integrated circuit layout tool, wherein:
the current cell is of a hierarchical layout; and
the hierarchical layout comprises a plurality of cells;
generating an overlay, the overlay comprising an abstraction of at least one object present in a higher level of the hierarchical layout that overlaps with, and is within a boundary of, the current cell; and
projecting the overlay onto the current cell in the view.

17. The computer system of claim 16, wherein the generating the overlay comprises:
building a hierarchy tree from a parent cell to the current cell;

identifying an instance of the current cell that overlaps the parent cell;
creating the overlay, the overlay comprising a cover cell, wherein the cover cell is empty; and
for at least one element in the hierarchy tree from the parent cell to the current cell:
  identifying presence of a metal shape in the element crossing the instance; and
  appending the metal shape into the cover cell as a blockage shape.

18. The computer system of claim 17, wherein the parent cell is selected from the group consisting of: a top cell of the hierarchical layout and a received selection of a cell at an intermediate level of the hierarchical layout.

19. The computer system of claim 17, wherein:
the identifying the instance of the current cell that overlaps the parent cell comprises identifying a plurality of instances of the current cell that overlap the parent cell; and
the operations further comprise:
  for each of the plurality of instances:
    for at least one element in the hierarchy tree from the parent cell to the current cell:
      identifying presence of a metal shape in the element crossing the respective instance; and
      appending the metal shape into the cover cell as a blockage shape.

20. The computer system of claim 16, wherein:
the overlay includes a blockage shape; and
the operations further comprise:
  receiving a selection of the blockage shape; and
  responsive to receiving the selection of the blockage shape, performing an action selected from the group consisting of: displaying information about an object corresponding to the blockage shape and displaying a window comprising a respective level of the hierarchical layout of the object corresponding to the blockage shape.

* * * * *